United States Patent [19]

Somer

[11] Patent Number: 4,734,657

[45] Date of Patent: Mar. 29, 1988

[54] RF MODEM WITH OSCILLATOR SWITCHING CIRCUIT

[75] Inventor: Gerald L. Somer, Sebastopol, Calif.

[73] Assignee: AMP Incorporated, Harrisburg, Pa.

[21] Appl. No.: 931,765

[22] Filed: Nov. 17, 1986

[51] Int. Cl.⁴ .............................................. H03B 5/32
[52] U.S. Cl. .................................... 331/116 R; 331/162
[58] Field of Search .................... 331/116 R, 162, 179, 331/177 V; 455/77, 113

[56] References Cited

U.S. PATENT DOCUMENTS 3,614,667 10/1971 Fletcher ...................... 331/116 R X Primary Examiner—Eugene R. LaRoche
Assistant Examiner—Robert J. Pascal
Attorney, Agent, or Firm—David L. Smith

[57] ABSTRACT

A channel switching oscillator circuit (230) in which the oscillator frequency is selected from one of a predetermined number of frequencies by switching into the oscillator circuit (230) one of a plurality of tank circuits (L4, L5, L6). The tank circuit (L4, L5, L6) is resonant with one of a plurality of crystals (Y2, Y3, Y4) in the oscillator (230) to generate a carrier signal at the predetermined frequency. The crystals (Y2, Y3, Y4) remain in the oscillator circuit (230) with no switching thereof as the frequencies at which the crystals (Y2, Y3, Y4) oscillate are sufficiently far apart, coupled with the high Q of the tank circuit (L4, L5, L6), that only one of the crystals (Y2, Y3, Y4) is resonant with each tank circuit (L4, L5, L6).

21 Claims, 3 Drawing Figures

RF MODEM WITH OSCILLATOR SWITCHING CIRCUIT

The present invention is related to the following concurrently filed, copending applications, each of which is hereby incorporated by reference, all of which have been assigned to the same assignee as the present application and include:

Application Ser. No. 931,573, "RF Modem with Improved Clock Recovery Circuit", filed Nov. 17, 1986, by G. Somer;

Application Ser. No. 931,576, "RF Modem with Improved Binary Transversal Filter", filed Nov. 17, 1986, by G. Somer and P. Walp; and Application Ser. No. 932,140, "Temperature Independent, Low Level, AM Modem Receiver", by G. Somer.

BACKGROUND OF THE INVENTION

This invention relates to radio frequency modulation and in particular to a radio frequency modem having an oscillator switching circuit capable of switching the oscillator to operate on any one of a plurality of predetermined frequencies without switching crystals into or out of the oscillator circuit.

Many radio frequency oscillators operate on a single frequency having a crystal resonant with a tank circuit at the operating frequency. Radio frequency oscillators that operate on multiple frequencies typically switch the crystal and have a tank circuit with a wide response to oscillate with all of the relatively close crystal frequencies. The crystals are not left in the oscillator circuit and the crystal circuit only is switched because if the frequencies of the crystals are too close together the undersirable condition may occur that more than one crystal will resonate with the same tank circuit. When the crystal frequencies are spaced farther apart in the frequency spectrum such as a few megahertz, a single tank circuit cannot resonate with the relatively closely spaced crystal frequencies; it is then necessary to switch the tank circuits at least.

While these switching circuits have been adequate, switching crystals requires attention to the effect on frequency of the oscillator of the switching device. Where the frequencies of the oscillator are relatively far apart in the frequency spectrum, the single tank circuit will not suffice. It would be desirable to have a radio frequency oscillator having frequency switching capacity that requires no switching in the crystal circuit and provides a separate tank circuit for each frequency produced by the oscillator.

SUMMARY OF THE INVENTION

In accordance with the present invention, a channel switching circuit is employed to switch one of a plurality of tank circuits into an oscillator circuit. The selected tank circuit is resonant with one of a plurality of crystals in the oscillator circuit to generate a carrier signal at a predetermined frequency. The crystals remain in the oscillator circuit with no switching because the frequencies at which the crystals oscillate are sufficiently for apart coupled with the high quality, Q, of the tank circuit that only one crystal is resonant with each tank circuit.

DESCRIPTION OF THE PREFERRED EMBODIMENT

Figure 1:
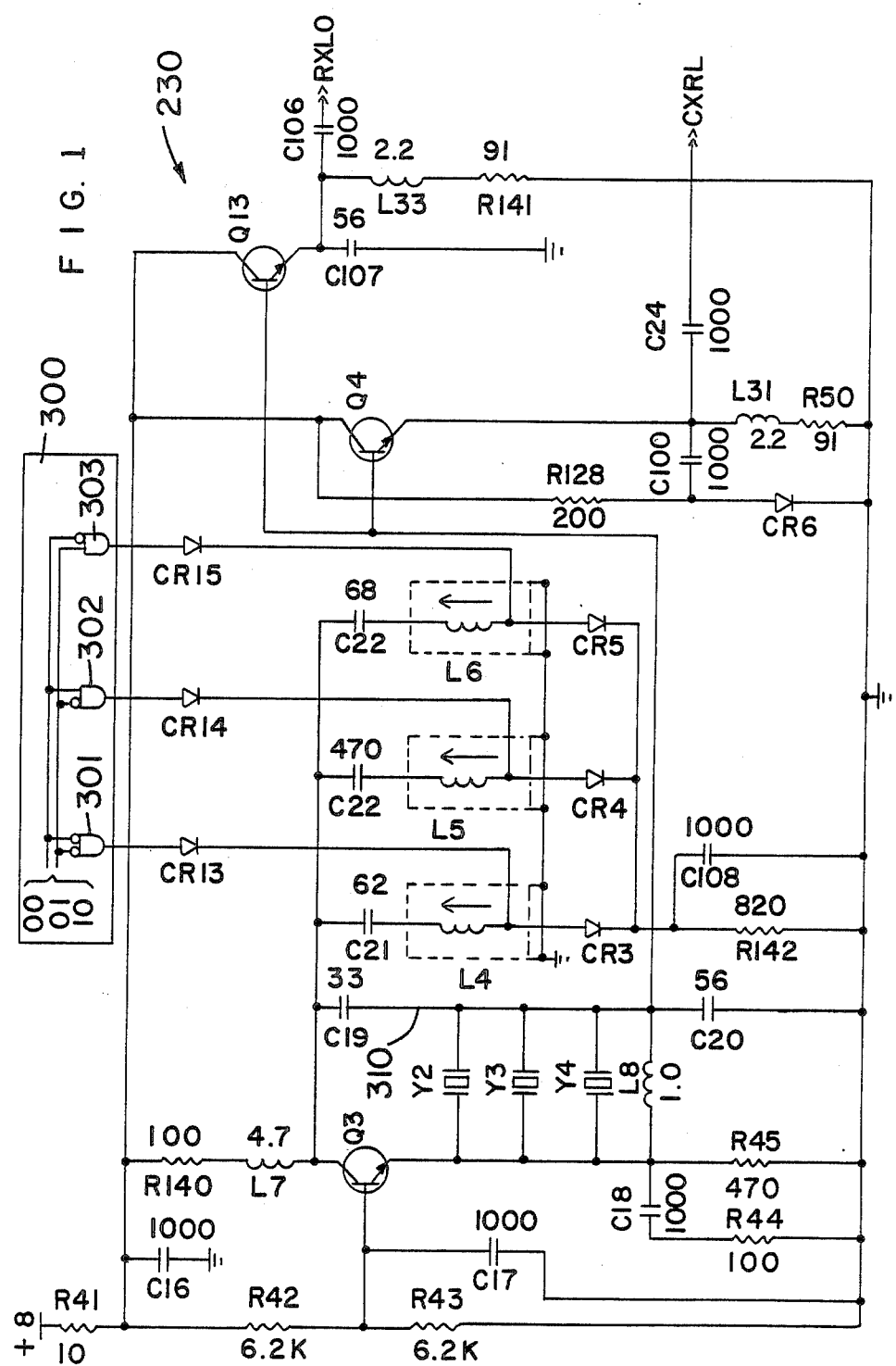
FIG. 1 is a schematic diagram showing a channel switching oscillator in accordance with the present invention.
Figure 2A:
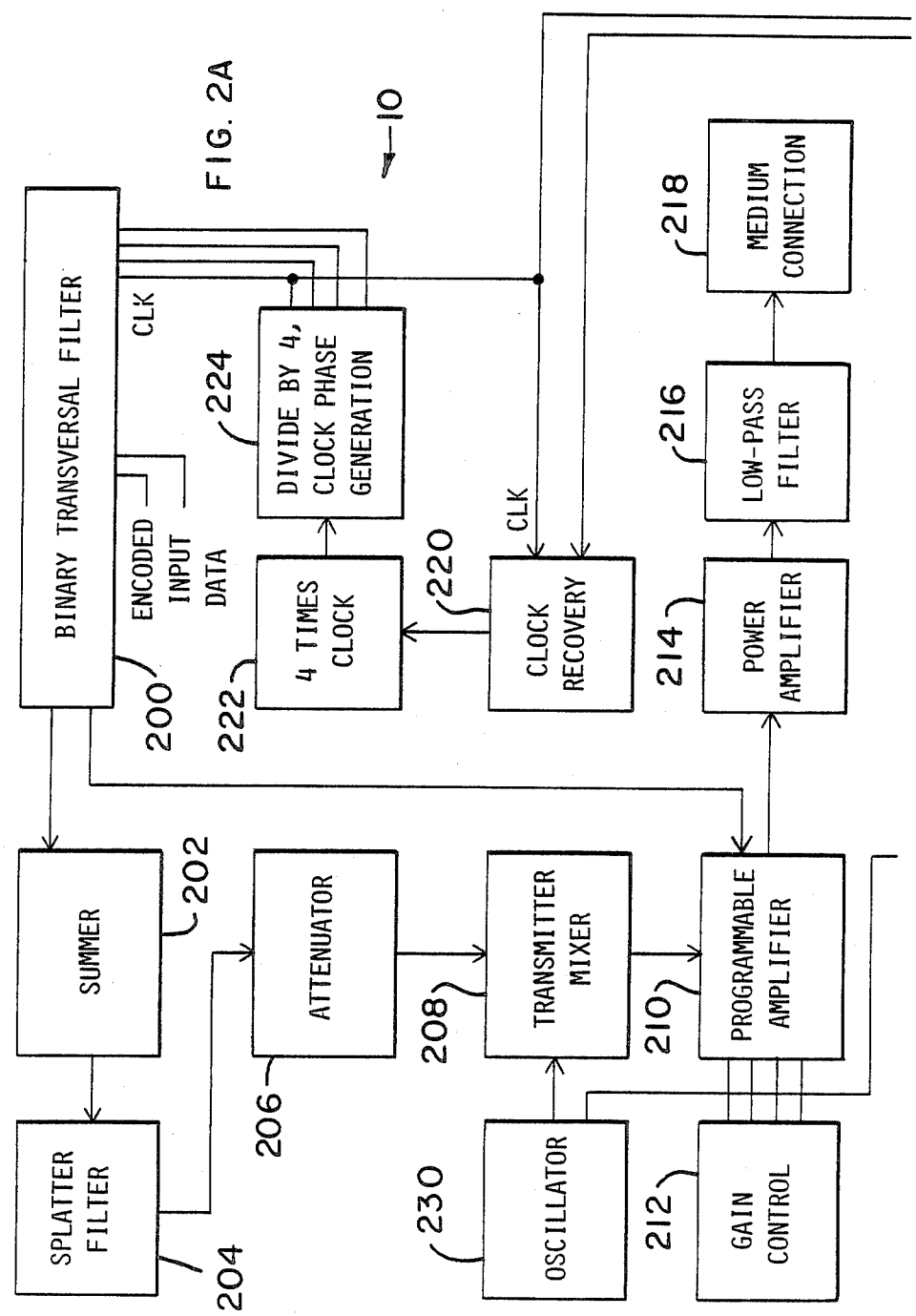
FIGS. 2A and 2B show respectively, in block diagram form, a radio frequency transmitter and receiver.
Figure 2B:
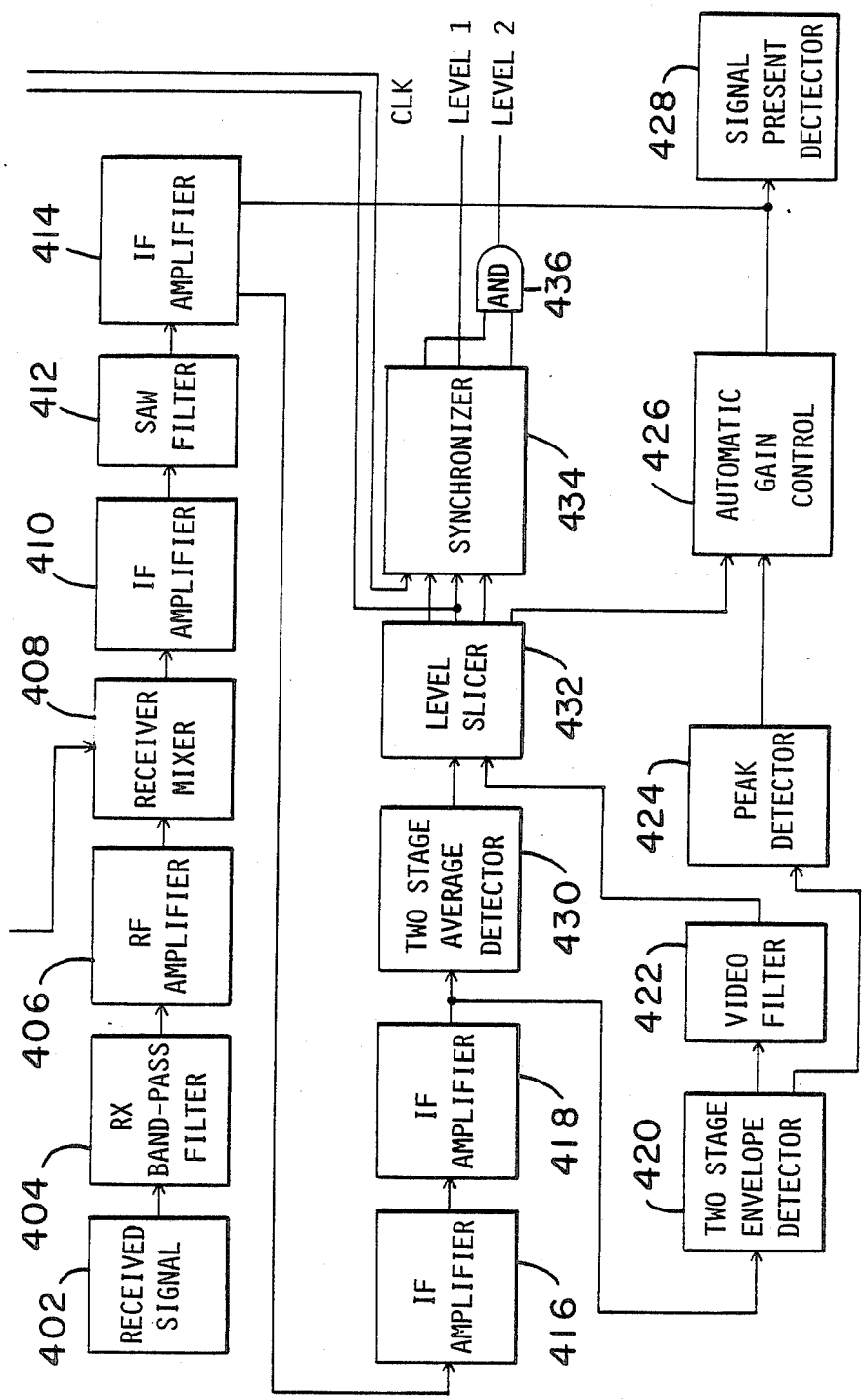

A channel switching oscillator 230 circuit is shown in FIG. 1 for changing the frequency of a radio frequency transmitter and receiver to any one of a plurality of predetermined channels. Resistances shown are in ohms, capacitances in picofarads, and inductances in microhenries. A radio frequency modem 10 in which the channel switching oscillator 230 circuit may be employed is shown in FIG. 2 with the transmitter shown in FIG. 2A and the receiver shown in FIG. 2B.

As seen in FIG. 1, resistor voltage divider R41, R42 and R43 provide the DC bias for transistor Q3 operating as a grounded base oscillator. Capacitor C17 assures that the base of transistor Q3 is grounded with respect to any AC signal. Transistor amplifier Q3 is configured as an oscillator and thus provides means for generating a time varying periodic signal.

Resistor R140 in series with choke L7 provides collector bias to transistor Q3. The reactance of choke L7 is high compared to the reactance of inductors L4, L5 or L6 being tuned so that the frequency of oscillation is not adversely affected. Resistor R140 assures that inductor L7 does not form a parasitic resonance with inductors L4, L5 or L6 and cause the oscillator to oscillate at an undesired frequency.

The tank circuits which are switched into the oscillator 10 circuit are comprised of inductors L4, L5 and L6. Capacitors C19 and C20 form a part of each tank circuit. Capacitors C21 in series with inductor L4 also forms part of the tank circuit when inductor L4 is switched into the oscillator circuit. Capacitor C21 need not be present in all tank circuits as C21 is used to cancel a portion of the reactance of inductor L4 to obtain resonance at the desired frequency. Similarly, capacitor C22 in series with inductor L5 compensates for the reactance of inductor L5 and capacitor C23 in series inductor L6 compensates for the reactance of inductor L6.

Transistor Q3 is configured as an overtone oscillator having a plurality of crystals in the emitter circuit and a corresponding plurality of tank circuits in the collector circuit. In the preferred embodiment the oscillator is shown having three crystals and three tank circuits, however the invention is not limited thereto. Crystals Y2, Y3 and Y4 provide frequency determining means which are respectively calibrated to one of the transmit frequencies 65.75 MHz, 77.75 MHz and 89.75 MHz. With the frequencies of the crystals a few megahertz apart, it is necessary to switch at least the tank circuit; the Q of the tank circuit can discriminate one crystal from the other. Each of the tank circuits comprising inductors L4, L5 and L6 is resonant with one of the three cyrstals. The crystals remain part of the emitter circuit and are not removed therefrom by switching or any other means as their frequencies are sufficiently far apart in the frequency spectrum in conjunction with the high Q of the tank circuits that only a single crystal is resonant with each tank circuit.

A capacitive divider comprised of capacitor C19 and C20 provides at a voltage divider point 310 therebetween feedback from the collector circuit to the emitter circuit through crystals Y2, Y3 and Y4. Inductor L8 in parallel with crystals Y2, Y3 and Y4 resonates out the parallel capacitance of all of the crystals at or near the operating frequency to eliminate that feedback path thereby making the oscillator more stable. With the parallel capacitance of each crystal resonated out, due to the high Q of each crystal, each crystal is seen as a high impedance by any time varying periodic signal not on or near the crystal frequency.

Typically a higher level of logic such as a network controller would determine which frequency the radio frequency modem 10 channel switching oscillator 230 would operate on. Once a particular frequency is selected, a modem 10 would operate for long time periods, possibly all of its life, on that frequency. The selected frequency of oscillation is implemented by channel select circuit 300 switching into the oscillator 230 one of the tank circuits.

The plurality of tank circuits comprised of inductors L4, L5 and L6 are banked together and reference to AC ground through capacitor C108. The tank circuits are individually switchable into the channel switching oscillator 230. Each of the tank circuits has a first diode between the tank circuit and ground. Diode CR3 is tied between inductor L4 and ground, diode CR4 is tied between inductor L5 and ground, and diode CR5 is tied between inductor L6 and ground. The cathodes of diodes CR3, CR4 and CR5 are tied together forming a common electrical point. Resistor R142 and parallel capacitor C108 form a bias means between the point common to the cathode of diodes CR3, CR4 and CR5 and ground.

A second diode associated with each tank circuit is connected between channel select circuit 300 and the anode of the first diode associated with each tank circuit. Diode CR13 is connected between channel select circuit 300 and the anode of diode CR3, diode CR14 is tied between channel select circuit 300 and the anode of diode of CR4 and diode CR15 is tied between channel select circuit 300 and the anode of diode of CR5. The switching current from channel select circuit 300 turns on one of diodes CR3, CR4 or CR5 as determined by the channel select circuit logic to select a particular tank circuit to be switched into the channel switching oscillator circuit. Typically, diodes CR3, CR4 or CR5 are energized by energizing a logic gate driver in channel select circuit 300.

To illustrate how a tank circuit is switched into oscillator circuit 10 and the function of resistor R142, an exemplary channel select circuit 300 is discussed. The channel select circuit 300 is not limited thereto and may be implemented in this or any known manner.

As shown schematically in FIG. 1, turning on diode CR3 is accomplished by providing a binary 00 signal to channel select circuit 300 thereby energizing AND gate 301 which provides current through diode CR13 which switches inductor L4 into the oscillator circuit. Simultaneously, a positive voltage is established at the cathode of diode CR3 which reverse biases unused diodes CR4 and CR5. Resistor R142 provides current limiting for diodes CR13, CR14 and CR15 as there is no other resistance in series therewith.

To change the frequency of the channel select circuit, a different binary code is provided to channel select circuit 300 de-energizing logic gate driver 301 supplying current to diode CR13 and simultaneously energizing one of the other logic gate drivers 302 or 303 thereby providing current to one of diodes CR14 or CR15 and switching the corresponding tank circuit L5 or L6 into the oscillator circuit, reverse biasing unused diodes causing another of crystals Y2, Y3 or Y4 to resonate thereby changing the frequency of oscillation of the oscillator.

The oscillator 230 output is taken from the voltage divider point 310 of the capacitive divider and is provided to transistors Q13 and Q4. Transistors Q13 and Q4 are buffer amplifiers that provide power gain to drive double balanced mixers as shown in FIG. 2 so the mixers do not load the oscillator and cause the oscillator to be pulled off frequency or cease oscillating. Using separate buffer amplifiers to drive each mixer provides an added advantage that the two mixers are isolated from each other as the only way a spurious signal could get from one mixer to the other is to pass back through a buffer amplifier. One of the oscillator outputs, CXRL, is applied to the transmitter mixer in order to convert the baseband signal up to the appropriate transmit channel. The other oscillator output, RXLO, is applied to the receiver mixer where the received signal at the selected channel is converted down to the intermediate frequency signal.

What is claimed is:

1. A channel switching oscillator for generating a radio frequency carrier signal, comprising:
    means for generating a time varying periodic signal;
    a plurality of nonswitchable frequency determining means for establishing the frequency of the periodic signal;
    a plurality of tank circuits individually switchable into the oscillator, each of said tank circuits resonant with a frequency determmining means; and
    means for switching each of the tank circuits into the oscillator, whereby the tank circuit switched into the oscillator resonates with a frequency determining means.

2. A channel switching oscillator as recited in claim 1 further comprising logic means for determining which tank circuit to switch into the oscillator.

3. A channel switching oscillator as recited in claim 1 further comprising buffer amplifier means for amplifying the time varying period signal.

4. A channel switching oscillator as recited in claim 1 wherein the periodic signal generating means comprises a transistor.

5. A channel switching oscillator as recited in claim 1 wherein each frequency determining means comprises a crystal.

6. A channel switching oscillator as recited in claim 1 wherein each tank circuit comprises an inductor.

7. A channel switching oscillator as recited in claim 6 wherein each tank circuit further comprises a capacitor.

8. A channel switching oscillator for generating a radio frequency carrier signal, comprising:
    a transistor amplifier configured as an oscillator for producing a time varying period signal;
    a capactive divider circuit between the transistor collector and ground, said capacitive divider circuit having a divided voltage point;
    a plurality of frequency determining means between the divided voltage point and the transistor emitter;
    a plurality of tank circuits between the transistor collector and ground, each of the tank circuits individually switchable into the oscillator;

controllable switching means for switching each of the tank circuits into the oscillator; and means for controlling the switching means to determine which tank circuit is switched into the oscillator.

9. A channel switching oscillator as recited in claim 8 wherein the frequency determining means are crystals.

10. A channel switching oscillator as recited in claim 8 wherein the means for controlling the switching means is a channel select circuit.

11. A channel switching oscillator as recited in claim 8 wherein the controllable switching means are interposed between the tank circuits and ground.

12. A channel switching oscillator as recited in claim 8 wherein the divided voltage point is part of each of said plurality of tank circuits.

13. A channel switching oscillator as recited in claim 8 wherein the controllable switching means comprises a plurality of diodes having a common cathode junction, further comprising bias means between the common cathode and ground for reverse biasing the diodes associated with the tank circuits not switched into the oscillator.

14. A channel switching oscillator as recited in claim 8 further comprising inductive means in parallel with the frequency determining means for resonating out parallel capacitance of the frequency determining means.

15. A channel switching oscillator as recited in claim 8 further comprising choke means between a power supply and the transistor collector for providing collector bias to the transistor.

16. A channel switching oscillator as recited in claim 8 further comprising buffer amplifier means for amplifying the time varying periodic signal.

17. A channel switching oscillator as recited in claim 8 wherein each tank circuit comprises an inductor.

18. A channel switching oscillator as recited in claim 17 wherein each tank circuit further comprises a capacitor.

19. A channel switching oscillator for generating a radio frequency carrier signal, comprising:
a transistor amplifier configured as an oscillator for providing a time varying periodic signal;
a capacitive divider circuit between the transistor collector and ground, said capacitive divider circuit having a divided voltage point;
a plurality of frequency determining crystals between the divided voltage point and the transistor emitter;
a plurality of tank circuits between the transistor collector and ground, said tank circuits individually switchable into the channel switching oscillator;
each of the tank circuits having a first diode between the tank circuit and ground, the cathodes of said first diodes forming a common point;
biad means between the common point and ground for reverse biasing the common point from ground potential;
a channel select circuit;
a second diode associated with each tank circuit, the anode of said second diode connected to the channel select circuit, the cathode of said second diode connected to the anode of each respective first diode, whereby to switch a tank circuit into the channel switching oscillator the channel select circuit energizes the second diode associated with the tank circuit to be switched which in turn energizes the respective first diode and generates a voltage across the bias means to reverse bias to the unused first diodes thus switching into the oscillator circuit one tank circuit of said plurality of tank circuits while preventing the other tank circuits from being switched into the oscillator circuit.

20. A channel switching oscillator as recited in claim 19 wherein the bias means comprises a parallel resistor-capacitor network.

21. A channel switching oscillator as recited in claim 19 wherein the divided voltage point is part of each of said plurality of tank circuits.

* * * * *

UNITED STATES PATENT AND TRADEMARK OFFICE
CERTIFICATE OF CORRECTION

PATENT NO. : 4,734,657

DATED : March 29, 1988

INVENTOR(S) : Gerald L. Somer

It is certified that error appears in the above-identified patent and that said Letters Patent is hereby corrected as shown below:

Claim 19, Column 6, line 17, the word "biad" should be --bias--.

Signed and Sealed this

Twelfth Day of May, 1992

*Attest:*

DOUGLAS B. COMER

*Attesting Officer*     *Acting Commissioner of Patents and Trademarks*